United States Patent [19]

Shanley, II et al.

[11] 4,432,016
[45] Feb. 14, 1984

[54] TRANSLATING CIRCUIT FOR TELEVISION RECEIVER ON-SCREEN GRAPHICS DISPLAY SIGNALS

[75] Inventors: Robert L. Shanley, II; Robert P. Parker, both of Indianapolis, Ind.

[73] Assignee: RCA Corporation, New York, N.Y.

[21] Appl. No.: 323,351

[22] Filed: Nov. 20, 1981

[51] Int. Cl.³ .............................................. H04N 5/22
[52] U.S. Cl. ...................................... 358/183; 358/22
[58] Field of Search ................. 358/183, 22, 181, 166, 358/169, 172; 307/243, 299 A, 313

[56] References Cited

U.S. PATENT DOCUMENTS

| | | | |
|---|---|---|---|
| 2,864,961 | 12/1958 | Lohman et al. | 307/88.5 |
| 3,449,596 | 6/1969 | Milberger et al. | 307/313 |
| 3,790,823 | 2/1974 | Briley | 307/255 |
| 4,218,698 | 8/1980 | Bart et al. | 358/22 |

*Primary Examiner*—Tommy P. Chin
*Attorney, Agent, or Firm*—E. M. Whitacre; P. J. Rasmussen; R. H. Kurdyla

[57] ABSTRACT

A DC coupled signal translating circuit for supplying auxiliary graphics information switching signals to a video signal processor. The switching signal comprises plural switching levels including a quiescent level. The translating circuit includes first and second complementary conductivity input transistors with interconnected emitter signal inputs for receiving switching currents representative of the graphics switching signals via a conductor which undesirably exhibits a parasitic capacitance. The transistors are biased to conduct a nominal quiescent current and develop collector output currents which are proportional to the input switching currents, and which are respectively coupled via current repeating networks to control inputs of the video processor. Switching delays attributable to the parasitic capacitances of the input coupling conductor are significantly reduced due to the emitter voltage clamping action of the input transistors for all conditions of the input switching signals.

11 Claims, 6 Drawing Figures

| TIME | TRANSISTOR CONDUCTION STATES FOR ON-SCREEN DISPLAY | | | | |
|---|---|---|---|---|---|
| | 112,114 | 100 | 101 | 116 | 117 |
| $T_0$ | OFF | ON | ON | ON | OFF |
| $T_1$ | OFF | OFF | OFF | OFF | ON |
| $T_2$ | ON | OFF | ON | ON | OFF |
| $T_3$ | OFF | OFF | OFF | OFF | ON |
| $T_4$ | OFF | ON | ON | ON | OFF |

TRANSLATING CIRCUIT FOR TELEVISION RECEIVER ON-SCREEN GRAPHICS DISPLAY SIGNALS

This invention concerns a circuit in a television receiver or equivalent video processing system for supplying auxiliary graphics image representative timing signals from a source of the graphics signals to video signal processing networks of the system. In particular, the invention concerns a current translating circuit for preserving the fast switching response of the graphics timing signals to reduce the likelihood of distorting the edges of displayed graphics information.

Many color television receivers include provision for electronic on-screen kinescope display of graphics characters representative of the number of the channel to which the receiver is tuned, for example. Such displays are typically generated by replacing normal video information with appropriately horizontally and vertically synchronized graphics representative signals developed by a suitable graphics character generator in the receiver, so that the graphics information is displayed on a given portion of the kinescope screen. One system of this type is described in U.S. Pat. No. 3,984,828—Beyers. Information displayed by such systems can include alphanumeric and graphics information along (e.g., "video games" and data displays), or mixed video and graphics information (e.g., superimposed channel number, time, subtitles, weather, sports or road traffic information), by employing appropriate electronic control circuits in the receiver. Graphics information signals are also commonly associated with a Teletext system, which involves transmitting graphics information through conventional television transmitting equipment, and receiving, decoding and displaying the graphics information by means of a television receiver in a known manner.

It is desirable for displayed graphics information to exhibit good edge definition, particularly along vertical edges. Good edge definition is produced by graphics switching signals with a fast switching response time (i.e., rapid amplitude transitions). The desired fast switching response time can be imparied by the manner in which the switching signals from the graphics source are coupled to the video signal processing circuits of the receiver. In a television receiver, switching signals from the graphics signal source are often coupled to appropriate video processing networks of the receiver by means of one or more conductors which often include a significant length of shielded cable for shielding the graphics signals from stray interference signals. Shielded cables (e.g., coaxial cables) commonly exhibit a capacitance per unit length (e.g., 30 to 50 picofarads per foot of length) which can undesirably impair the fast switching characteristic (i.e., rapid amplitude transitions) of the graphics switching signals. Specifically, the time associated with charging and discharging such capacitances in response to the switching signals reduces the speed of switching signal amplitude transitions, thereby introducing an unwanted switching signal delay. The effects of this delay can be perceived by a viewer of displayed video and graphics information as a smear at the edges of displayed graphics information, such as during the transition from displayed normal video information to displayed graphics information, and vice-versa. These unwanted effects can also be produced by parasitic capacitances associated with unshielded signal coupling conductors.

According to the present invention, there is disclosed herein a signal translating circuit for coupling switching signals to a switched utilization network, wherein the signal delaying effects of parasitic capacitances are significantly reduced. The signal translating circuit includes first and second complementary conductivity input transistors with interconnected emitter signal inputs for receiving switching currents representative of switching signals exhibiting first and second amplitude levels of mutually complementary sense relative to a quiescent level, and desirably exhibiting rapid amplitude transitions. The switching currents are coupled via a conductor which undesirably exhibits a parasitic capacitance. The transistors are biased to conduct a nominal quiescent current and develop output collector currents which are proportional to the input switching currents. The output collector currents are respectively coupled via current translating networks to control inputs of the utilization network. Switching delays attributable to the parasitic capacitances of the input coupling conductor are significantly reduced due to the emitter voltage clamping action of the input transistors for all conditions of the input switching signals.

In accordance with a feature of the invention, the output collector currents are coupled to the utilization network via plural current repeating circuits.

In the drawing

Figure 1:
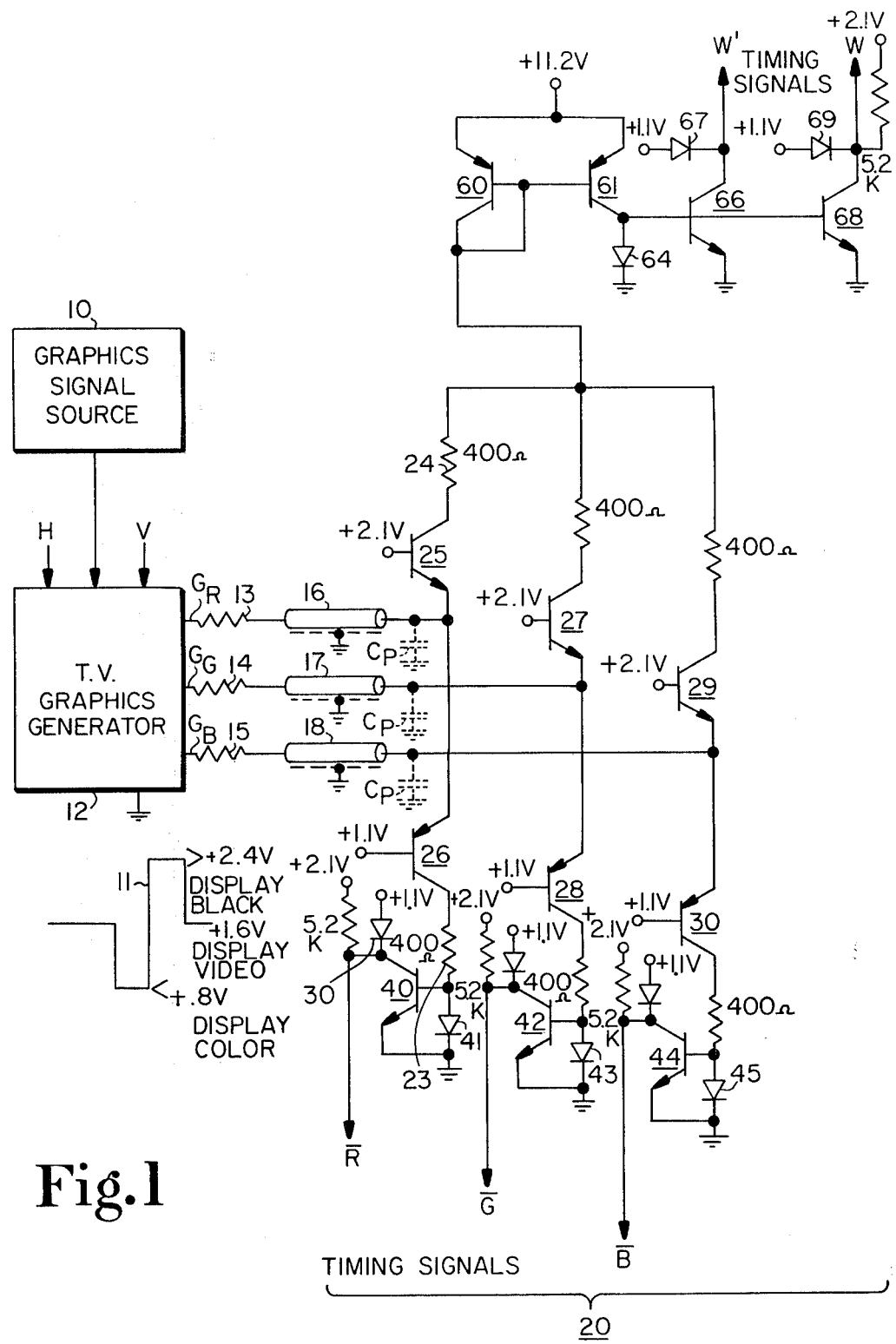
FIG. 1 shows apparatus, partly in block diagram form and partly in schematic circuit diagram form, including a source of graphics representative signals and a translating circuit for supplying graphics timing signals derived from the source to video signal processing networks of a television receiver.

In FIG. 1, signals representative of graphics information to be displayed are provided by means of a graphics signal source 10. For example, when the graphics information to be displayed corresponds to the number of the broadcast channel to which a television receiver is tuned, source 10 responds to signals derived from the channel tuning system of the receiver to develop a binary coded signal representative of the channel number of which the receiver is tuned. This signal is applied to a suitable television graphics signal generator 12 (e.g., a microprocessor). Graphics generator 12 is synchronized by horizontal (H) and vertical (V) scanning deflection signals to cause the graphics data to be displayed in a particular segment of the viewing screen of the kinescope of the receiver. Other information such as the time of day and Teletext information can also be applied to generator 12 for suitable conversion to video signal display format. Signals from source 10 contain intelligence for determining when graphics information is to be displayed instead of normal broadcast video information, and the color of the graphics information, for example.

Graphics character generator 12 provides plural, suitably timed output signals $G_R$, $G_G$ and $G_B$ respectively corresponding to red, green and blue graphics signal information. These signals are supplied to a graphics signal translating circuit 20 which provides output "black drive" graphics switching signals $\overline{R}$, $\overline{G}$, $\overline{B}$ and output "white drive" graphics switching signals W and W'.

Graphics generator 12 provides tri-state logic outputs for each of the $G_R$, $G_G$, $G_B$ graphics signals. As indicated by waveform 11, the tri-state logic output signal manifests a first logic level of +1.6 volts when no graphics information is to be displayed (i.e., when the kinescope of the television receiver responds normally to display broadcast video signals), a second logic level of less than +0.8 volts when graphics information is to be displayed with a color other than black, and a third logic level of greater than 30 2.4 volts when black graphics information is to be displayed. The signal outputs of graphics generator 12 are respectively coupled to inputs of circuit 20 via current determining resistors 13, 14, 15 and shielded conductors (e.g., coaxial cables) 16, 17, 18.

Circuit 20 comprises complementary conductivity type emitter coupled, emitter input transistor pairs 25 and 26, 27 and 28, and 29 and 30 which respectively respond to graphics signals $G_R$, $G_G$, $G_B$. Collector currents conducted by transistors 26, 28 and 30 are respectively replicated by means of current mirror (current repeating) translating circuits including transistor 40 and diode 41, transistor 42 and diode 43, and transistor 44 and diode 45. Graphics switching control signals $\overline{R}$, $\overline{G}$ and $\overline{B}$ are derived from the collector outputs of transistors 40, 42 and 44. The levels of signals $\overline{R}$, $\overline{G}$ and $\overline{B}$ are a function of the conductive state of associated current mirror transistors 40, 42 and 44 in response to the level of graphics signals $G_R$, $G_G$ and $G_B$. Collector currents conducted by transistors 25, 27 and 29 are combined and replicated by means of current mirror circuits including diode connected transistor 60 and transistor 61, diode 64 and transistor 66, and diode 64 and transistor 68. Graphics switching control signals W and W' are similar in timing and magnitude and are derived from the collector outputs of transistors 68 and 66, respectively. The levels of signals W and W' are a function of the conductive state of current mirror transistors 68 and 66 in response to the graphics signals from generator 12.

Circuit 20 couples graphics control signals $G_R$, $G_G$ and $G_B$ from the outputs of graphics generator 12 to control inputs of video signal processing circuits of the receiver (as will be seen from the subsequent discussion of FIG. 2) in a manner which substantially maintains the fast switching characteristic of the control signals as applied to the video signal processing circuits in the form of graphics timing control signals $\overline{R}$, $\overline{G}$, $\overline{B}$, W and W'. Specifically, signals $G_R$, $G_G$ and $G_B$ are translated via circuit 20 in a manner which reduces to an acceptable minimum the signal delaying effects of parasitic capacitances between the output of graphics generator 12 and the inputs to the video signal processing circuits which utilize signals $\overline{R}$, $\overline{G}$, $\overline{B}$, W and W'. Such parasitic capacitances primarily include distributed capacitances $C_p$ associated with shielded coaxial signal coupling cables 16, 17 and 18.

In circuit 20, input transistors 25, 26 and associated current mirror 40, 41 are structurally and functionally similar to input transistors 27, 28 and 29, 30, and their associated current mirror networks, respectively. The circuit including transistors 60, 61, 66 and 68 is common to input transistors 25, 27 and 29. Accordingly, the following discussion of the operation of input transistors 25, 26 in response to graphics control signal $G_R$ also applies to input transistors 27, 28 and 29, 30 in response to signals $G_G$ and $G_B$.

In the embodiment of FIG. 1, tri-state logic signal $G_R$ (as well as signals $G_G$ and $G_B$) illustrated by waveform 11, is provided by an output voltage source of graphics generator 12. Signal $G_R$ is coupled to cable 16 by means of a current determining resistor 13. The value of resistor 13 (e.g., on the order of four kilohms) is chosen to convert the voltage source which provides signal $G_R$ into an equivalent current source, whereby a current representative of signal $G_R$ is conducted by cable 16 to the interconnected emitter inputs of complementary transistors 25 and 26.

Transistors 25 and 26 are arranged in a common base configuration and are biased to conduct a small quiescent (i.e., idle) emitter current of approximately 10 microamperes. The magnitude of the quiescent current is not critical. The quiescent currents of transistors 25 and 26 are established by respective DC base bias voltages of +2.1 volts and +1.1 volts derived from suitable low impedance voltage sources. The base-emitter junctions of transistors 25 and 26 exhibit a quiescent voltage drop of approximately +0.5 volts, whereby transistors 25 and 26 each exhibit a quiescent emitter voltage of approximately +1.6 volts. The emitters of transistors 25 and 26 therefore each represent a low impedance voltage source.

When broadcast video information is to be displayed, no current flows in resistor 13 and conductor 16, and transistors 25 and 26 conduct only the small quiescent current. The quiescent collector current of transistor 25 is repeated by current mirror 60, 61 and flows in diode 64, and is further repeated by current mirrors 64, 66 and 64, 68. Hence the currents conducted by transistors 66 and 68 substantially equal the quiescent current conducted by transistor 25, and the current conducted by transistor 40 substantially equals the collector current conducted by transistor 26. When graphics information is to be displayed with a red color, signal $G_R$ exhibits a logic level of less than +0.8 volts, causing input transistor 25 to increase conduction. The increased emitter current of transistor 25 is conducted to ground via conductor 16, resistor 13, and the output circuit of generator 12. The increased current conducted by transistor 25 is repeated by current mirrors 60, 61; 64, 66; and 64, 68. At this time the current conducted by transistors 26 and 40 substantially corresponds to the quiescent current component conducted via transistor 25 and diode 60. It is noted that since resistor 13 converts the voltage change of waveform 11 to an equivalent current change, such voltage change does not appear at the emitter of transistor 26, whereby the conduction of transistor 26 is substantially unaffected by such voltage change. When black graphics information is to be displayed in response to a signal $G_R$ logic level of greater than +2.4 volts, input transistor 26 is caused to increase conduction. The increased emitter current of transistor 26 is conducted from the output of generator 12 via resistor 13 and conductor 16, and a corresponding current is conducted by associated current mirror transistor 40. At this time the current conducted by transistor 25 substantially corresponds to the quiescent current component conducted via transistor 26. Also in this case, the voltage change associated with signal $G_R$ does not appear at the emitter of transistor 25. It should be recognized that the currents conducted by diodes 60, 64 and transistors 61, 66 and 68 correspond to the sum of the collector currents of transistors 25, 27 and 29, the level of which is a function of graphics control signals $G_R$, $G_G$ and $G_B$.

The arrangement of input transistors 25 and 26 significantly reduces the undesired signal delaying effects otherwise produced by the time required to charge and discharge distributed parasitic capacitances $C_p$ associated with signal coupling conductor 16, whereby the desired rapid amplitude transitions (switching transitions) associated with signal $G_R$ are substantially preserved. Specifically, and as discussed below, this is accomplished by employing current coupling of the switching signal via resistor 13 and conductor 16, and voltage clamping at the output of conductor 16, to minimize voltage variations which would otherwise introduce unwanted signal delays. The use of such current coupling and clamping significantly reduces the signal delaying effect of the term dv/dt in the expression $I = C\ dv/dt$, where I is the current through the parasitic capacitances, C is the value of the parasitic capacitances, and dv/dt represents the rate of charging and discharging the parasitic capacitance voltage with time.

As noted previously, resistor 13 converts the output signal voltage from generator 12 to an equivalent current when the signal from generator 12 is provided from a voltage source. Current determining resistor 13 is not required when the output signal source of generator 12 is an appropriate current source. The output of signal coupling conductor 16 at the emitter inputs of transistors 25 and 26 is clamped to a substantially fixed voltage of approximately +1.6 volts for all conditions of switching signal $G_R$ since transistors 25 and 26 remain conductive for all conditions of signal $G_R$. Thus the emitter inputs of transistors 25 and 26 serve to continually clamp the voltage on conductor 16 to a substantially fixed level, thereby reducing signal amplitude transition delays which would otherwise be produced by the charging and discharging of the parasitic capacitances if significant voltage variations on conductor 16 were permitted to occur.

The clamping voltage at the interconnected emitters of transistors 25 and 26 varies slightly by approximately +0.1 volts with variations in the logic levels of signal $G_R$. However, these small voltage variations are considered to be acceptably small, and can be reduced by increasing the quiescent (idle) current conducted by transistors 25 and 26 in response to the base bias voltages. However, such increased idle current conduction may be unacceptable in some applications (e.g., when circuit 20 is constructed as an integrated circuit) due to the increased current consumption and power dissipation which would result.

Parasitic capacitances associated with circuit 20, primarily in the form of transistor collector capacitances of approximately one picofarad, do not compromise the effectiveness of circuit 20 for providing translated versions of signals $G_R$, $G_G$, and $G_B$ (namely output signals $\overline{R}$, $\overline{G}$, $\overline{B}$, W and W') with the desired rapid amplitude transitions, as follows.

Input transistors 25 and 26 are arranged in a common base configuration and receive fixed base bias from respective low impedance voltage sources (e.g., the base bias voltages are supplied via respective emitter follower transistors). Accordingly, Miller-effect multiplication of the collector-to-base capacitance is not present. Also, the collector voltages of transistors 25 and 26 change very little with changes in the conductive states of transistors 25 and 26 due to the small value of resistors 24 and 23 and the total change in the collector current level of transistors 25 and 26 of approximately 160 microamperes. Resistors 23 and 24 serve as current limiting protection resistors and are not required in all cases.

The collector of diode connected transistor 60 is clamped to its base voltage, which changes very little with changes in the current conduction experienced by transistor 60. Similarly, diode 64 acts as a low impedance voltage clamp with respect to the collector of transistor 61, whereby the collector voltage of transistor 61 changes very little with changes in the current conduction experienced by transistor 61. In this embodiment the collector capacitances of output transistors 40 and 68 do not compromise the effectiveness of circuit 20 even though voltage variations occur at these points. Voltage variations do not occur at the collector output of transistor 66.

Figure 2:
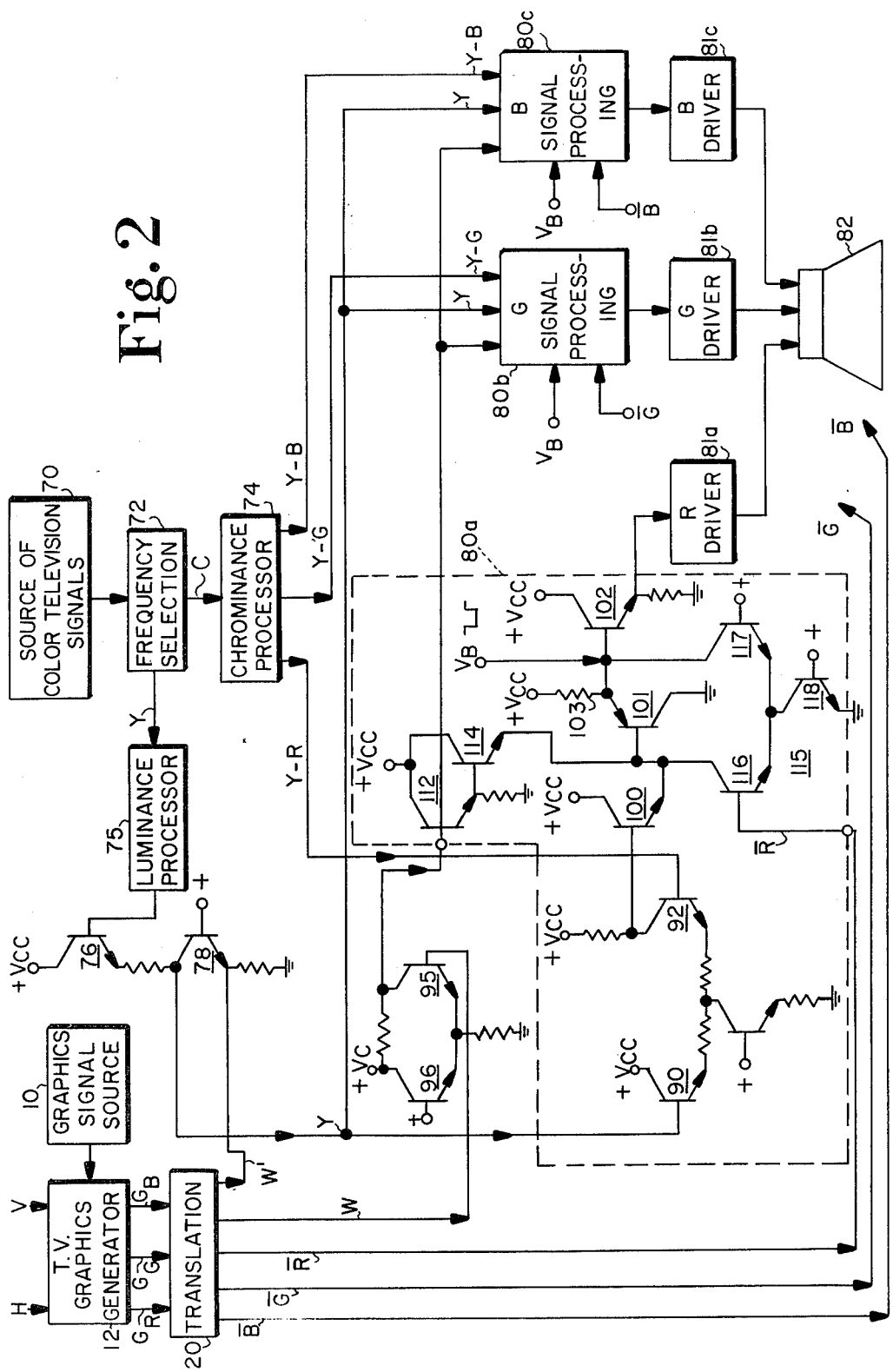
FIG. 2 shows a portion of a color television receiver illustrating the arrangement of FIG. 1 in conjunction with video signal processing circuits of the receiver for producing on-screen display of graphics information.

The current translation rather than voltage translation provided by circuit 20 produces an additional advantage when, as in this case and as will be seen in FIG. 2, the on-screen graphics display function requires that more than one similarly timed control signals (i.e., W and W') be applied to different points in the video processing path. This is readily accomplished in described current translating arrangement by means of plural current repeaters 64, 66 and 64, 68.

It is also noted that input transistors 25 and 26 are biased to conduct switching currents in a linear operating region to prevent their operation in a saturated conductive state, since charge stored by saturated transistors prevents them from turning off quickly and thereby introduces an unwanted switching delay. In addition, transistors 40, 66 and 68 are respectively prevented from saturating by means of normally non-conductive collector diodes 30, 67 and 69, which are biased from a +1.1 volt source to conduct before the associated transistor becomes saturated.

In FIG. 2, color television signals from a source 70 are processed by a frequency selection network 72 (e.g., including a comb filter) to produce separated luminance (Y) and chrominance (C) components of the television signal. A chrominance processor 74 responds to the separated chrominance component for developing Y-R, Y-G and Y-B color difference signals, which are respectively coupled to red, green and blue signals processing networks 80a, 80b and 80c. The separated luminance signal is coupled via a luminance processor 75 and an emitter follower transistor 76 to each of networks 80a, 80b and 80c, where the lluminance signal is combined with the respective color difference signals to produce output red, green and blue color image representative signals. These color signals are applied to a color kinescope 82 via respective red, green and blue video output driver stages 81a, 81b and 81c for reproducing an image on the screen of the kinescope.

Color signal processing networks 80a, 80b and 80c are similar in structure and operation. Therefore the following description of red color signal processing network 80a also applies to networks 80b and 80c.

Network 80a includes an input matrix amplifier comprising differentially connected transistors 90 and 92 which respectively receive the luminance signal and the Y-R red color difference signal. A red color signal is developed in the collector output circuit of transistor 92, and is supplied to red signal driver 81a by means of a coupling network comprising a plurality of cascade connected emitter follower transistors 100, 101 and 102. Output signals from network 80a are supplied to driver 81a via NPN follower transistor 102. The output of network 80a is blanked during normal horizontal and vertical image blanking intervals of the television signal in response to a negative-going blanking signal $V_B$ applied to the emitter of PNP follower transistor 101.

Network 80a also includes emitter follower transistors 112 and 114 connected in a Darlington configuration, and a switched current steering network 115 comprising differentially connected transistors 116, 117 and an associated current source transistor 118 which supplies an operating current for current steering transistors 116 and 117. Transistors 112, 114 and network 115 enable the receiver to operate in an auxiliary "on-screen" display mode for the purpose of displaying auxiliary graphics information during prescribed intervals in response to timing signals $\overline{R}$, $\overline{G}$, $\overline{B}$, W and W' from network 20.

Signal W from network 20 is applied to the base input of a transistor 95 which is arranged in a differential configuration with a transistor 96. A control signal developed at the collector output of transistor 95 in response to the level of signal W is applied to Darlington connected emitter follower transistors 112 and 114 at a first graphics control input of red signal processing circuit 80a. The control signal from transistor 95 is also applied to corresponding graphics control inputs of green and blue signal processing networks 80b and 80c. Signal W' from network 20 is coupled to the emitter of a current source transistor 78 associated with luminance signal coupling transistor 76. Signal $\overline{R}$ from network 20 is applied to the base electrode of differentially connected transistor 116 of red signal processing network 80a, corresponding to a second graphics control input of network 80a. Signals $\overline{G}$ and $\overline{B}$ are respectively applied to corresponding second graphics control inputs of green and blue signal processing networks 80b and 80c.

Figures 3, 4:
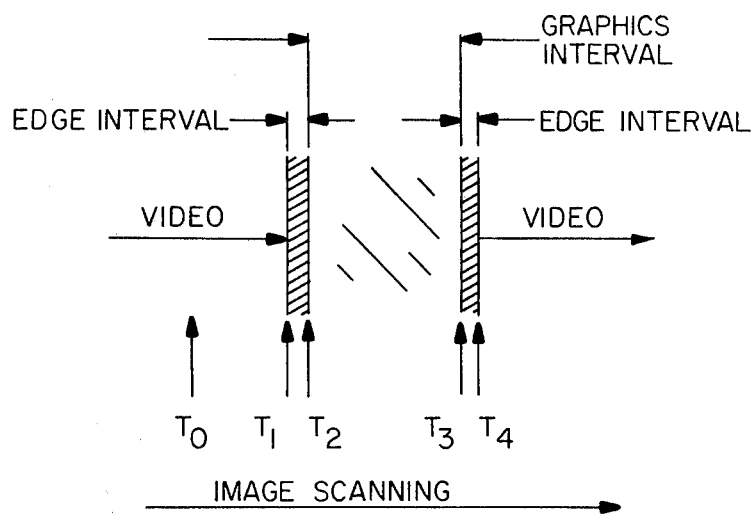
FIG. 3 illustrates a portion of a displayed graphic symbol generated by the arrangement of FIG. 2.
FIG. 4 shows a table depicting the operating states of circuit elements associated with the video signal processing networks for enabling display of video and graphics information.

The operation of the system of FIG. 2 in a normal video display mode and in a graphics display mode will now be discussed in conjunction with FIGS. 2, 3 and 4. For purposes of the following discussion it will be assumed that the graphics information to be displayed comprises a red graphics character occurring during a graphics interval, preceded and followed by a narrow black border occurring at the edges of the graphics symbol. Accordingly, FIG. 3 depicts a portion of one horizontal image scanning line. Normal video information is displayed during $T_0$ prior to time $T_1$, and after time $T_4$. The on-screen display interval comprises a leading black edge interval from time $T_1$ to $T_2$, a graphics symbol display interval between times $T_2$ and $T_3$, and a following black edge interval from time $T_3$ to $T_4$.

The table in FIG. 4 shows the conductive ("ON") and non-conductive ("OFF") states of transistors 112, 114, 100, 101, 116 and 117 in processor 80a of FIG. 2 for producing the display shown in FIG. 3. Thus during the normal video signal intervals during time $T_0$ and after time $T_4$, emitter follower transistors 100 and 101 conduct video signals from transistor 92 to transistor 102, which in turn conducts the video signals to driver 81a. At this time signal W' exhibits a level which maintains current source transistor 78 normally conductive, while signal W biases transistor 95 so that transistors 112 and 114 are rendered non-conductive. Signal $\overline{R}$ biases differentially connected current steering transistor 116 to conduct, whereby the current from current source transistor 118 is conducted by signal coupling follower transistor 100 via transistor 116. During this time signal processing networks 80b and 80c exhibit the same operating condition as network 80a.

At the beginning of the on-screen display interval commencing at time $T_1$, differential switching transistor 116 is rendered non-conductive in response to signal $\overline{R}$, whereby transistor 117 conducts and the current from current source transistor 18 flows through transistor 117. Specifically, current from transistor 118 flows in a path including emitter resistor 103 of transistor 101 and transistor 117. This conductive state of switching transistor 117 renders emitter follower transistor 100 and 101 non-conductive, and provides the mechanism whereby current source transistor 118 sources the current for producing a black display (i.e., the output of network 80a is blanked). Transistors 112 and 114 remain nonconductive in response to signal W. Accordingly, normal video signals are inhibited in the output of network 80a, and the kinescope produces a black display. In this case the black display occurs during the edge interval between times $T_1$ and $T_2$, during which time signal processing networks 80b and 80c exhibit the same operating condition as network 80a.

At the beginning of the (red) graphics display interval commencing at time $T_2$, differentially connected current steering transistors 116 and 117 change conductive state in response to signal $\overline{R}$ such that transistor 116 is rendered conductive and transistor 117 is rendered non-conductive. Therefore the current from source transistor 118 is conducted by transistor 116. At this time graphics drive transistors 112 and 114 are rendered conductive in response to signal W, and the emitter current of transistor 114 is supplied by current source transistor 118 via switching transistor 116. The emitter of transistor 100 is reverse biased in response to the bias supplied from the emitter of conductive transistor 114, and emitter follower coupling transistor 101 returns to a conductive state in response to switching transistor 117 being non-conductive. Transistors 101 and 102 therefore conduct a red graphics enabling signal to red driver 81a between times $T_2$ and $T_3$ for producing a red graphics display in response to the output of conductive graphics drive transistors 112, 114.

The outputs of green and blue signal processing networks 80b and 80c are blanked during the red graphics display interval in response to signals $\overline{G}$ and $\overline{B}$. These signals cause the switching transistors in networks 80b and 80c which correspond to switching transistors 116 and 117 of network 80a to exhibit the conductive states required for rendering the follower transistor corresponding transistor 101 non-conductive, in the manner discussed previously (i.e., corresponding transistors 116 and 117 in networks 80b and 80c are rendered non-conductive and conductive, respectively).

During the following black edge interval between times $T_3$ and $T_4$, the operating condition of networks 80a, 80b and 80c is the same as during leading black edge interval $T_1$–$T_2$ discussed previously. Similarly, the operating condition of these networks during the normal video interval after time $T_4$ is the same as during the video interval including time $T_0$, as also discussed previously.

Colors other than red can be displayed during the graphics interval. For example, white can be displayed when signal processing circuits 80a, 80b and 80c all exhibit the operating condition shown in the table of FIG. 4 for the interval between times $T_2$ and $T_3$. In such case the outputs of all of these networks will be enabled, or unblanked, during the graphics interval. A yellow color graphic can be displayed when red signal processing network 80a and green signal processing network 80b both exhibit the operating condition shown in FIG. 4 for the interval from $T_2$ to $T_3$, and when blue signal processing network 80c exhibits the condition shown in FIG. 4 for the interval from time $T_1$ to $T_2$ except that corresponding transistors 112 and 114 in network 80c are "ON" or conductive. In this case the outputs of red and green networks 80a and 80b will be enabled or unblanked, and the output of the blue network 80c will be blanked, whereby a yellow kinescope display will be produced.

Transistors 112, 114 of network 80a and the corresponding transistors in networks 80b and 80c are rendered conductive whenever a color other than black is to be displayed during on-screen display intervals. During the graphics interval from time $T_2$ to $T_3$, current source transistor 78 increases conduction in response to signal W' for shifting the DC level of the luminance signal derived from the collector of transistor 78 in a direction to insure that follower transistor 100 remains off.

The described system is capable or producing several colors during the on-screen display intervals, including black and white, the primary colors red, green and blue, and complementary colors yellow, cyan and magenta, by unblanking the outputs of appropriate combinations of red, green and blue signal processing networks 80a, 80b and 80c. Additional information concerning the operating of the system of FIG. 2, particularly with respect to the operating advantages associated with signal processing networks 80a, 80b and 80c, is disclosed in a copending U.S. patent application Ser. No. 323,197 of R. L. Shanley, II, titled "Switching Circuit For Television Receiver On-Screen Display", filed Nov. 20, 1981 incorporated herein by reference.

Figure 5:
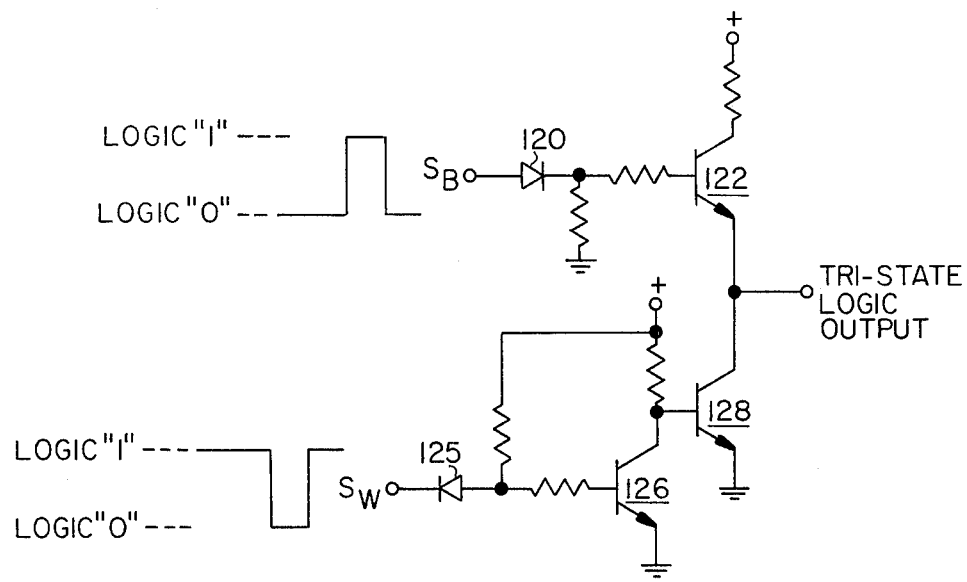
FIGS. 5 and 6 illustrate circuits suitable for supplying signals to the input of the translating circuit in FIG. 1.
Figure 6:
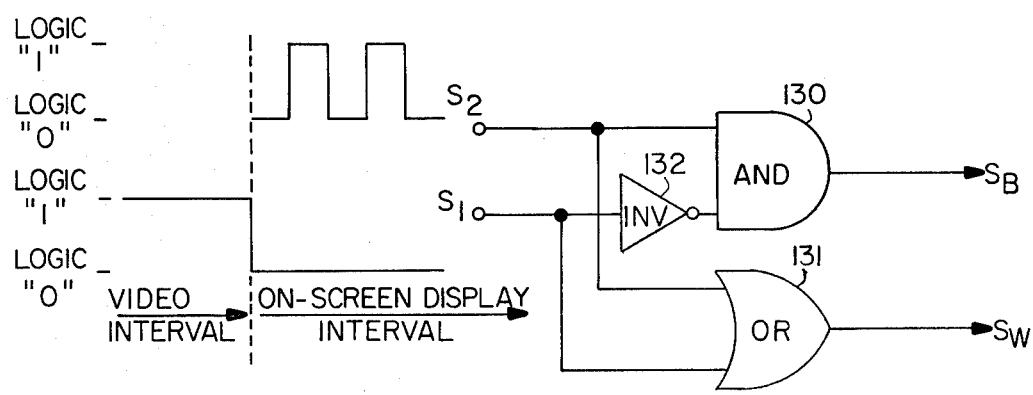

FIGS. 5 and 6 show circuit arrangements suitable for providing tri-state logic signals as discussed in conjunction with FIG. 1 with respect to graphics signals $G_R$, $G_G$ and $G_B$.

In FIG. 5, a tri-state logic signal is provided from the interconnected emitter of transistor 122 and collector of transistor 128 in response to a "black" graphics control signal $S_B$ coupled to transistor 122 via a diode 120, and in response to a "white" graphics control signal $S_W$ applied to transistor 128 via a diode 125 and a transistor 126. The tri-state output signal will exhibit a high logic level for producing a black graphics display when signals $S_B$ and $S_W$ exhibit "1" logic levels, and will exhibit a low logic level for producing a color graphics display when signals $S_B$ and $S_W$ exhibit a "0" logic level. The tri-state logic output signal will manifest an intermediate level for enabling normal broadcast video information to be displayed when signals $S_B$ and $S_W$ exhibit "0" and "1" logic levels, respectively.

FIG. 6 shows a logic circuit for developing signals $S_B$ and $S_W$ for use with the circuit of FIG. 5. In FIG. 6, input signals $S_1$ and $S_2$ are supplied as shown to a circuit comprising an AND logic gate 130, an OR logic gate 131, and an inverter 132. Signal $S_1$ exhibits a "1" logic level during video intervals when normal broadcast video information is to be displayed, and a "0" logic level during on-screen display intervals when graphics information is to be displayed. During the latter intervals, signal $S_2$ exhibits a "1" logic level when a black graphic color is to be displayed, and a "0" logic level when a graphic of a color other than black is to be displayed.

What is claimed is:

1. Signal translating apparatus for coupling switching signals to a switched utilization circuit, said apparatus comprising:
    a source of current representative of switching signals exhibiting first and second amplitude levels of mutually complementary sense relative to a quiescent level;
    first and second mutually complementary conductivity type transistors each with a base electrode, a collector output electrode and a signal input consisting of an emitter electrode, said emitter electrodes of said first and second transistors being connected in common;
    means for coupling said current source to said emitters of said first and second transistors for causing said first transistor to conduct collector current proportional to said first amplitude level of said switching signal, and for causing said second transistor to conduct collector current proportional to said second amplitude level of said switching signal;
    means for biasing said first and second transistors to conduct a quiescent current; and
    means for respectively coupling output collector currents of said first and second transistors to control inputs of said utilization circuit.

2. Apparatus according to claim 1, wherein
    said apparatus is DC coupled;
    said biasing means comprises a source of DC voltage coupled to said base electrodes of said first and second transistors; and
    said first and second transistors operate in a linear current conduction region in response to currents representative of said switching signals from said source.

3. Apparatus according to claims 1 or 2, wherein
    said output current coupling means comprise current repeater means.

4. Apparatus according to claims 1 or 2, wherein
    said output current coupling means of said first transistor comprises plural current repeater means with outputs respectively coupled to plural control inputs of said utilization circuit.

5. In an image reproducing system including a kinescope for displaying an image in response to image representative signals applied thereto; a signal path for coupling image representative signals to said kinescope; a source of image representative video signals coupled to said video path; and a source of auxiliary image representative graphics switching signals; signal translating apparatus responsive to said graphics switching signals for coupling switching signals to said signal path for timing the display of video and graphics information by said kinescope, said apparatus comprising:
    a source of current representative of said graphics switching signals, said graphics switching signals exhibiting first and second amplitude levels of mutually complementary sense relative to a quiescent level;

first and second mutually complementary conductivity type transistors each with a base electrode, a collector output electrode, and a signal input consisting of an emitter electrode, said emitter electrodes being connected in common;

means for coupling said current source to said emitters of said first and second transistors for causing said first transistor to conduct collector current proportional to said first amplitude level of said graphics switching signal, and for causing said second transistor to conduct collector current proportional to said second amplitude level of said graphics switching signal;

means for biasing said first and second transistors to conduct a quiescent current; and means for respectively coupling output collector currents of said first and second transistors to control inputs of said signal path.

6. Apparatus according to claim 5, wherein
said apparatus is DC coupled;
said biasing means comprises means for providing a DC voltage to said base electrodes of said first and second transistors; and
said first and second transistors operate in a linear current conduction region in response to said representative currents.

7. Apparatus according to claims 5 or 6, wherein
said output current coupling means comprise current repeater means.

8. Apparatus according to claims 5 or 6, wherein
said output current coupling means of said first transistor comprises plural current repeater means with outputs respectively coupled to plural control inputs of said signal path.

9. Apparatus according to claim 5, wherein
said kinescope is caused to selectively display video signal information, graphics information of a color other than black, or black graphics information in response to said levels of said graphics switching signal.

10. Signal translating apparatus responsive to a multiple-level input switching signal, comprising:
a source of current representative of switching signals exhibiting first and second amplitude levels of mutually complementary sense relative to a third level;

first and second mutually complementary conductivity type transistors each with a base electrode, a collector output electrode and a signal input emitter electrode, said emitter electrodes being connected in common;

means for biasing said first and second transistors to conduct a quiescent current; and means for coupling said current source to said emitters of said first and second transistors for causing said first transistor to conduct collector output current proportional to said first amplitude level of said switching signal and for conducting quiescent current in response to said second and third levels, and for causing said second transistor to conduct collector output current proportional to said second amplitude level of said switching signal and for conducting quiescent current in response to said first and third levels.

11. Signal translating apparatus responsive to a multiple-level input switching signal, comprising:
a source of current representative of switching signals exhibiting first and second amplitude levels of mutually complementary sense relative to a third level;

first and second mutually complementary conductivity type transistors each with a base electrode, a collector output electrode, and a signal input emitter electode, said emitter electrodes being connected in common;

means, with an input coupled to said current source and an output coupled to said emitters of said first and second transistors, for coupling said representative current to said emitters of said first and second transistors for causing said first transistor to conduct collector output current proportional to said first amplitude level of said switching signal, and for causing said second transistor to conduct collector output current proportional to said second amplitude level of said switching signal; and means for biasing said first and second transistors such that said first and second transistors each present substantially fixed clamping voltage to said output of said coupling means in the presence of said first, second and third amplitude levels of said input switching signals.

* * * * *